United States Patent [19]

Wong

[11] Patent Number: 4,879,007
[45] Date of Patent: Nov. 7, 1989

[54] SHIELD FOR PLATING BATH

[75] Inventor: Chi W. Wong, Kowloon, Hong Kong

[73] Assignee: Process Automation Int'l Ltd., Kowloon, Hong Kong

[21] Appl. No.: 282,751

[22] Filed: Dec. 12, 1988

[51] Int. Cl.$^4$ .................. C25D 5/02; C25D 17/06
[52] U.S. Cl. .................. 204/15; 204/225; 204/242; 204/279; 204/286; 204/DIG. 7; 204/297 R
[58] Field of Search .............. 204/286, 297 R, 297 W, 204/225, DIG. 7, 106, 275, 27, 279, 23, 15, 242

[56] References Cited

U.S. PATENT DOCUMENTS

| | | | |
|---|---|---|---|
| 2,859,166 | 11/1958 | Grigger | 204/297 R X |
| 3,090,823 | 5/1963 | Roach | 204/297 W X |
| 3,821,097 | 6/1974 | Ettel | 204/106 |
| 3,862,891 | 1/1975 | Smith | 204/27 |
| 4,113,586 | 9/1978 | Cook et al. | 204/297 R X |

Primary Examiner—Donald R. Valentine
Attorney, Agent, or Firm—St. Onge Steward Johnston & Reens

[57] ABSTRACT

A floating shield is provided for use in an electrolytic plating bath. The shield comprises an elongated trough in which substrates are loaded for plating. The substrates are held in the trough with the lower edge of each substrate below the plane of the edges of the trough. The trough prior to loading is sufficiently buoyant to float on the surface of the electrolyte but sinks into the bath after loading with substrates. In one embodiment the trough is slidably mounted for reciprocating vertical movement in guide members which form part of a mechanical agitator mounted in the bath. The floating shield device serves to facilitate deposition of a uniformly thick layer of metal on the substrate and avoids excessive deposition at the lower extremities of the substrate.

17 Claims, 3 Drawing Sheets

SHIELD FOR PLATING BATH

BACKGROUND OF THE INVENTION

1. Field of the Invention

This invention relates to an improved process and apparatus for electrolytic plating of substrates and is more particularly concerned with a process and apparatus for controlling the uniformity of thickness of electroplated coatings of metal on substrates.

2. Description of the Prior Art

In the electroplating of a coating of metal such as copper and the like on a substrate it is desirable and, in many cases, essential that the coating so applied have a uniform thickness throughout all areas thereof. One example of this is found in the fabrication of printed circuit boards. Thus, the current technology for production of a conductive path between two or more layers of a printed circuit board involves the electroless chemical deposition of a thin layer of copper in holes drilled through the board. The thickness of this layer is then increased by the electrolytic deposition of copper. In order to maintain the hole sizes within design parameters it is important that the thickness of the copper deposited by the electroplating be uniform at all locations on the board. After the electroplating has been completed a part of the copper on the external surface of the board is removed by chemical etching while the required copper circuitry, protected by an etch resist, is left in place. If the electrodeposited layer of copper on the board is not uniform in thickness, the width of the lines in the circuit may be reduced during the etching time necessary for complete removal of copper in areas of high thickness.

The uniformity of thickness of coating produced by electrodeposition of a metal such as copper depends largely on achieving uniform current distribution over the cathode. This, in turn, depends to a large degree on the anode-cathode geometry. Methods of producing a uniform cathode current density frequently involve protection of high current density areas by shields placed in the plating solution between the anode and cathode to form a physical barrier to the field; Loch U.S. Pat. No. 4,323,433 shows a typical device of this type. Such shields must be configured to accomodate a particular geometrical arrangement of anode to cathode for best results. Hence, when the size or shape of the cathode changes, a new shield design must be employed.

Another method of preventing high plating thickness at the edges (high current density areas) of a substrate involves the use of an uncoated metal plating rack which surrounds the work load and diverts current flow from the board edge. This method suffers a number of disadvantages. Thus, large amounts of metal are deposited on the rack. This metal has to be stripped from the rack at frequent intervals thereby leading to additional costs as well as wastage of metal and the necessity to remove metal from the stripping solution prior to environmentally sound disposal of the latter waste solution. Further, in order for the device to be effective it is necessary to fill any windows or gaps in the rack. In the case of substrates of varying size and shape, this is frequently difficult to accomplish without resorting to the use of "dummy" substrates, i.e. substrates prepared in a shape to match those of the actual substrates to be plated but having no usefulness other than serving to fill the window. Such a practice is clearly undesirable for obvious reasons.

The present invention provides a method and apparatus for controlling the uniformity of thickness of coatings of metal elecrtrodeposited on substrates. The key to achieving such control lies in the use of a buoyant shield of novel construction which also serves as a rack for holding a series of substrates to be plated. Various types of racks for use in plating baths, including racks provided with buoyancy, have been described in the art. Illustratively, Elsenheimer U.S. Pat. No. 2,362,474 describes a rack for suspending holloware in a plating bath. The rack is provided with flotation material which causes the rack to be rotated through 180° in the vertical direction as it is lowered into the bath and to be rotated back to its original position as it is withdrawn from the bath. Saffel U.S. Pat. No. 2.654,707 and Schaer U.S. Pat. No. 3,901,788 show similar devices.

Fukanuma U.S. Pat. No. 3,658,663 describes a rack for holding articles such as transistor heads so that only a portion of the article (the outer leads in the case of the transistor heads) is immersed in the plating bath.

The present invention provides a device which serves a double purpose by acting as a cathode shield and also as a buoyant rack for holding the substrates to be plated.

SUMMARY OF THE INVENTION

The invention comprises a shielding device for use in an electrolytic plating bath, said device comprising:

an elongated trough adapted to be slidably mounted in said bath for reciprocal movement in a vertical plane;

said trough being provided with means for supporting one or more electroplatable substrates in a substantially vertical plane with the lower edge of each of said substrates located below the plane in which lie the upper edges of said trough;

said trough having buoyancy sufficient in the unloaded condition to float on said plating bath but insufficient to prevent immersion in said bath in the loaded condition; and said trough having a plurality of perforations in the upper region of the sides thereof.

The invention also comprises an apparatus for electrolytic deposition of metal on a substrate comprising a container for electrolyte, a cathode and anode mounted in said container and a shielding device of the invention slidably mounted in said container. The invention also comprises a method for electrolytic deposition on a substrate of a coating of metal of uniform thickness using an electrolyte bath equipped with anode, cathode and a shielding device of the invention.

DETAILED DESCRIPTION OF THE INVENTION

The process and apparatus of the invention will be described in detail by reference to the accompanying drawings.

Figure 1:
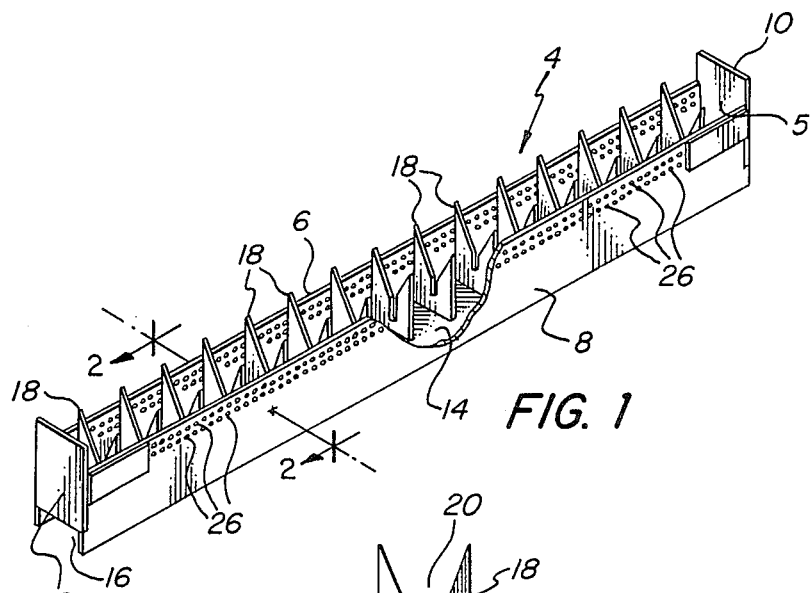
FIG. 1 shows in perspective view, partially cutaway, a cathode shield in accordance with the invention.
Figure 2:
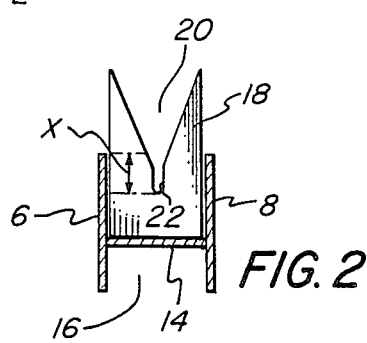
FIG. 2 is a cross-sectional view taken along the line 2—2 of the cathode shield shown in FIG. 1.
Figure 3:
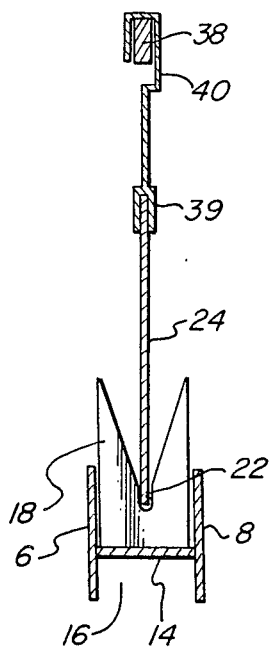
FIG. 3 is a cross-sectional view of a cathode shield as shown in FIG. 2 with an electroplatable substrate in place.

FIG. 1 shows a perspective view, with one side partially cutaway to show details of the interior, of a shielding device shown overall as (4) according to the invention. The shield (4) comprises an elongated trough (5) bounded by sidewalls (6) and (8), end plates (10) and (12) and a floor (14). The latter is raised above the level of the lower edges of the sidewalls (6) and (8) thus leaving an open compartment (16) beneath the floor (14) of the shield. Disposed within the shield are a plurality of plates (18) which serve to support the substrates (not shown in FIG. 1) which are to be electroplated. As seen in FIG. 1, and more particularly in FIG. 2 which is a cross-sectional view taken along the line 2—2 in FIG. 1, each of the plates (18) is provided with a V-shaped notch (20) which terminates at the apex of the V in a notch or indentation (22) in which the lower edge of a substrate (24) is received as shown in cross-section in FIG. 3. As shown in FIG. 2, the lowest point in notch (22) is below the level of the upper edge of walls (6) and (8) by a distance "x." In general, the distance "x" is within the range of about 2 cms to about 10 cms and preferably in the range of about 3 cms to about 6 cms although values of "x" higher than or lower than this can be employed if desired. Preferably, however, the distance "x" is not less than about 1.5 cms.

Referring again to FIG. 1, each of the sidewalls (6) and (8) has a plurality of perforations (26) in the upper regions thereof to permit electrolyte in the bath to flow therethrough into and out of the trough (5). The number and arrangement of these perforations is not critical although it is preferred that no perforations are present in either sidewall below the level of the bottom of notch (22) (see FIGS. 2 and 3).

Figure 5:
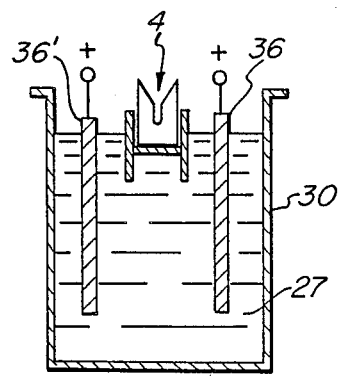
FIG. 5 is a schematic, cross-sectional view of a cathode shield of the invention installed in unloaded condition in a plating bath.
Figure 7:
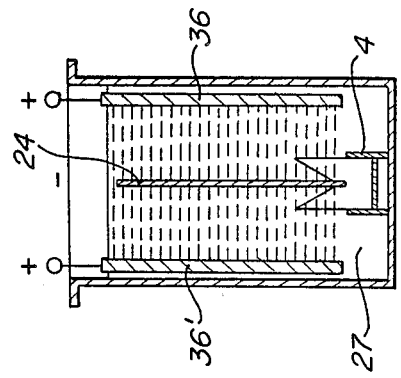
FIGS. 6 and 7 are schematic cross-sectional views of a cathode shield of the invention installed in the loaded condition in a plating bath.
Figure 6:
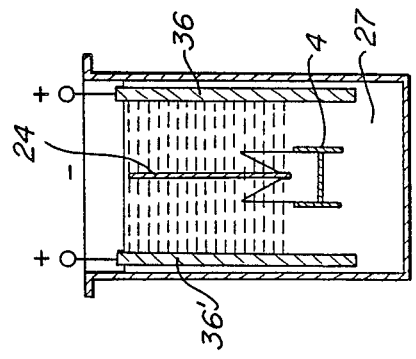

The components of trough (5) and plates (18) are advantageously prepared by injection molding or like means as a single unitary whole or in pieces which are assembled by melt sealing or like means from plastic material such as polyethylene, polypropylene and the like which impart sufficient buoyancy to the device (4) to enable it to float in the electrolyte (27) of the plating bath in the unloaded condition as shown substantially in cross-section in FIG. 5. In the loaded condition the device (4) is caused to be immersed in the bath to a depth which varies according to the size and weight of the substrate loaded therein. FIGS. 6 and 7 show schematically, in cross-section, the depth to which the device is immersed when loaded with different size substrates. The components of trough (5) and plates (18) may also be fabricated from plastic material such as polyvinyl chloride which is of a density such that device (4) does not have sufficient buoyancy to float in the unloaded condition. In this event, material such as a block or blocks of polystyrene foam or polyurethane foam is attached to device (4), advantageously by placement of the appropriate amount of such foam block in compartment (16) [see FIGS. 1, 2 and 3], to impart sufficient buoyancy to the device (4) to enable it to float in the unloaded condition. The amount of foam or other buoyancy material added to device (4) in this manner is insufficient to prevent the device from becoming immersed in the loaded condition. The appropriate amount of auxiliary buoyant material required can be determined readily by a process of trial and error.

Figure 4:
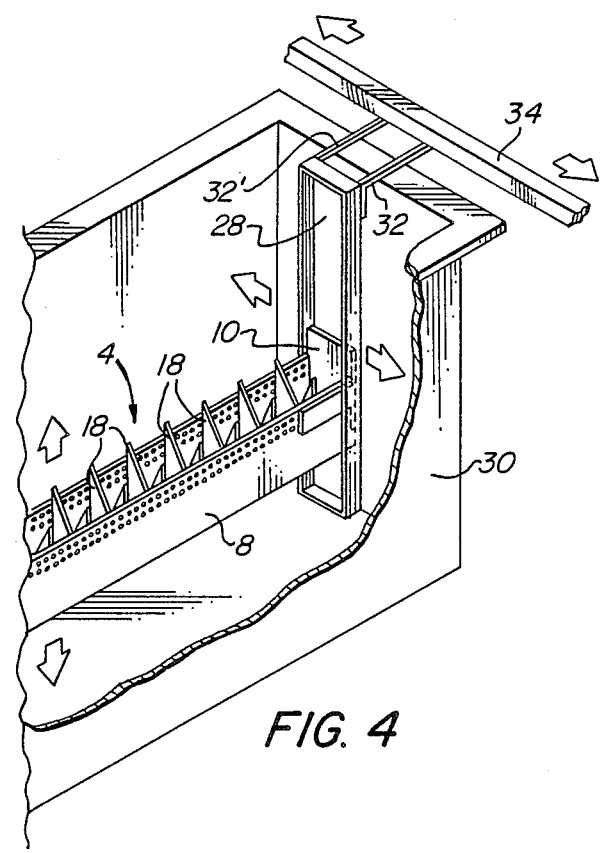
FIG. 4 is a perspective view in partial cutaway showing the cathode shield of FIG. 1 mounted in a plating bath.

FIG. 4 shows in partial cutaway a perspective view illustrating one manner in which the device (4) is mounted in a plating bath (30) in accordance with the invention. In this embodiment the end (10) of device (4) is slidably mounted in vertical guide member (28). the other end (12) of device (4) is also slidably mounted in a second vertical guide member (not shown) aligned parallel to guide member (28) and proximate the opposite wall of bath (30). Vertical guide member (28) is attached by brackets (32) and (32') to arm (34) which forms part of a frame (not shown) to which limited reciprocating motion can be imparted in the direction indicated by the arrows by appropriate reciprocating drive means (not shown). The second vertical guide member (not shown) referred to above is also attached in similar manner to an arm corresponding to (34) on the opposite side of bath (30) which arm forms part of the same frame in which arm (34) is incorporated.

The reciprocating motion imparted to device (4) in the above manner encourages circulation of electrolyte around the substrates suspended in the plating bath. This motion takes place in the gap between twin anodes (36) and (36') shown in cross-section in FIG. 5 which anodes each extend substantially across the width of bath (30) in a direction parallel to the longitudinal axis of device (4). These anodes (36) and (36') are not shown in FIG. 4 in order not to obscure the details of the manner in which the device (4) is mounted in bath (30).

Figure 9:
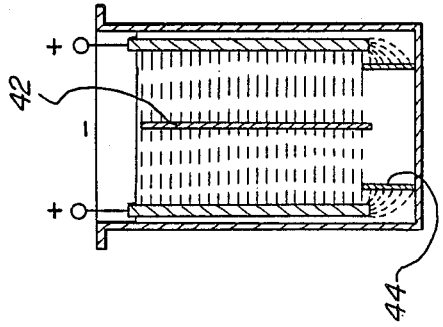
FIGS. 8 and 9 show in schematic form the electric field distribution in a plating bath equipped with a fixed cathode shield of the prior art.
Figure 8:
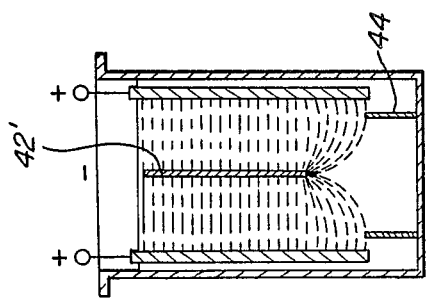

In operation of an electroplating process in accordance with the invention the substrates to be plated are loaded into the notched plates (18) of shield device (4) with the lower edge of each substrate received in the notches (20) in said plates (18). The substrates are thereby held in a substantially vertical plane as illustrated in cross-section in FIG. 3 and in partial cutaway perspective view in FIG. 11. The substrates (24) are each connected to cathode bus bar (38) by means of clamp (39) and connecting harness (40). The weight of the substrates causes the loaded shield device (4) to submerge in the electrolyte (27) to an extent depending upon the total weight of substrates as shown in FIGS. 6 and 7. The horizontal lines in both of the latter figures represent the distribution of the electrical field in the bath while electroplating is in progress. It will be seen that the field is uniform over the whole surface of the substrate held by the shield and that there is no significant increase in the field at the lower extremity of the substrate (24) whether the substrate extends down the bath to a limited extent as in FIG. 6 or to the full extent as shown in FIG. 7. In contrast, as shown schematically in FIGS. 8-10, the shields previously employed in the art give rise to significantly different electrical field distribution. Thus, FIG. 9 shows the effect of a conventional fixed shield (44) on the field distribution. So long as the lower edge of the substrate (42) extends below the plane of the upper edge of shield (44) there is no significant increase in field at said lower edge. However, if a shorter substrate (42') is employed with the same shield as shown in FIG. 8, there is a marked increase in field distribution at the lower edge of the substrate. This results in greater thickness of deposited metal in the lower area of the substrate than in the rest. Hence, in order to use such a conventional fixed sheild it is necessary to provide a shield of the correct dimension for each particular substrate in order to give the desired shielding effect. This is highly inconvenient in commercial operations since it means that, whenever the size of substrate is changed, an appropriate change of shield has to be made. In contrast, the shield of the present invention can serve to accommodate a variety of different sizes of substrate and automatically adjusts thereto by reason of its mode of construction and the buoyancy which is inherent therein which enables the shield to sink to the desired level in the bath depending on the weight of the substrate.

Figure 10:
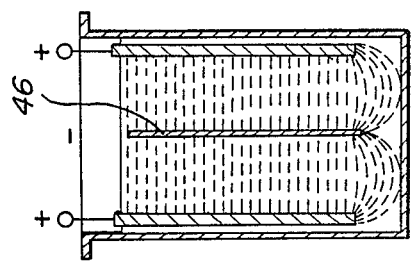
FIG. 10 shows in schematic form the electric field distribution in a plating bath which has no cathode shield.
Figure 11:
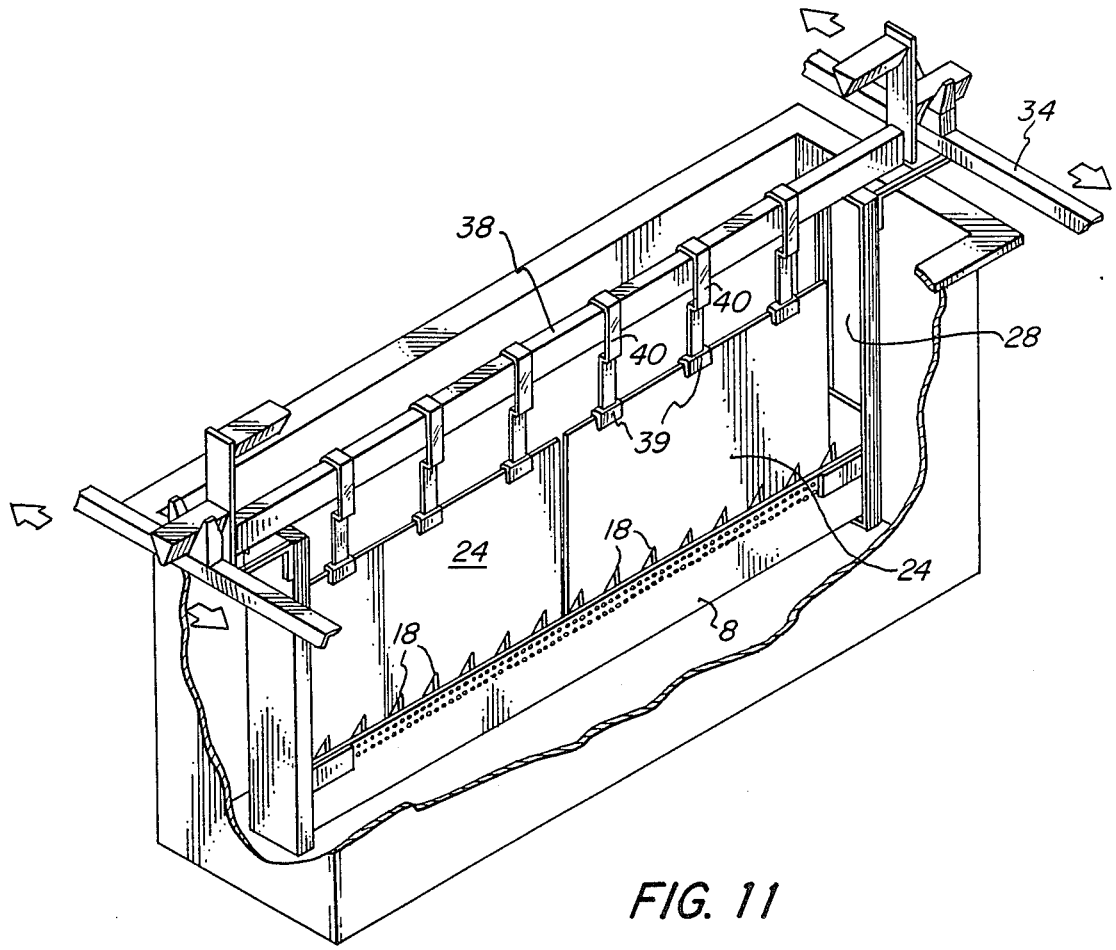
FIG. 11 shows in partial cutaway a cathode shield of the invention installed in a plating bath.

FIG. 10 illustrates the distribution of electric field in a bath which lacks any cathode shielding device and again shows the increased distribution of field around the lower edge of substrate (46).

The cathode shielding device of the invention and the method of utilizing said device in an electroplating bath have been described above by reference to various specific embodiments shown in the drawings appended hereto. The scope of the invention is not limited to these particular embodiments, and various modifications which will be readily apparent to those skilled in the art can be made to said illustrative embodiments without departing from the scope thereof.

The invention provides an improved cathode shield device for use in an electroplating bath and process. The device automatically adapts to varying sizes and weights of substrates, is very easy to load, relatively simple in construction and contributes significantly to the economies of an electroplating operation by reason of the time and labor which is saved by its utilization.

What is claimed is:

1. In a method for the electrolytic deposition of a coating of metal having uniform thickness on an electroplatable substrate as cathode in an electrolyte bath equipped with anode, the improvement comprising supporting said substrate in a substantial vertical plane in an elongated trough, said trough being slidably mounted at each end in guide members and adapted for confined movement in a vertical plane in said electrolytic bath, wherein the lower edge of said substrate is located below the plane in which lies the upper edges of said trough.

2. A method in accordance with claim 1 wherein said trough is provided with a plurality of perforations in the upper region of the sides thereof.

3. A method in accordance with claim 1 wherein said trough has buoyancy sufficient in the unloaded condition to float on said plating bath, but insufficient buoyancy to prevent immersion in said bath in the loaded condition.

4. A method in accordance with claim 1 wherein said metal is copper and said substrate is a printed circuit board.

5. A cathode shielding device for use in an electrolytic plating bath, said device comprising:

an elongated trough adapted to be slidably mounted in said bath for confined movement in a vertical plane within said bath;

said trough being provided with a plurality of plates having V-shaped notches, said plates being aligned substantially in parallel vertical planes transverse to the longitudinal axis of said trough, for supporting one or more electroplatable substrates in a substantially vertical plane with the lower edge of each of said substrates located below the plane in which lies the upper edges of said trough;

said trough having buoyancy sufficient in the unloaded condition to float on said plating bath but insufficient buoyancy to prevent immersion in said bath in the loaded condition; and said trough having a plurality of perforations in the upper region of the sides thereof.

6. A cathode shielding device according to claim 5 wherein the lowest point in said V-shaped notches is below the plane in which lies the upper edges of said trough.

7. A cathode shielding device for use in an electrolytic plating bath, said device comprising:

an elongated trough slidably mounted in a frame within which said trough is capable of confined movement in a vertical plane within said bath, said frame being provided with drive means for imparting reciprocal movement in a horizontal plane within said bath to said frame and to said trough slidably mounted in said frame;

said trough being provided with means for supporting one or more electroplatable substrates in a substantially vertical plane with the lower edge of each of said substrates located below the plane in which lies the upper edges of said trough;

said trough having buoyancy sufficient in the unloaded condition to float on said plating bath but insufficient buoyancy to prevent immersion in said bath in the loaded condition; and said trough having a plurality of perforations in the upper regions of the sides thereof.

8. A cathode shielding device according to any of claims 5, 6 and 7 wherein said elongated trough is fabricated from buoyant plastic material.

9. A cathode shielding device according to any of claims 5, 6 and 7 wherein said elongated trough is fabricated from polypropylene or polyethylene.

10. A cathode shielding device according to any of claims 5, 6 and 7 wherein said elongated trough is provided with auxiliary buoyancy material.

11. An apparatus for electrolytic deposition of metal on a substrate, said apparatus comprised of a container for electrolyte, a cathode and an anode mounted in said container, and a cathode shielding device, said cathode shielding device comprising:

an elongated trough slidably mounted in said container and adapted for confined movement in a vertical plane within said container;

said trough being provided with a plurality of plates having V-shaped notches, said plates being aligned substantially in parallel vertical planes transverse to the longitudinal axis of said trough, for supporting one or more electroplatable substrates in a substantially vertical plane with the lower edge of each of said substrates located below the plane in which lies the upper edges of said trough;

said trough having buoyancy sufficient in the unloaded condition to float on electrolyte present in said container, but insufficient buoyancy to prevent immersion in said electrolyte in the loaded condition; and said trough having a plurality of perforations in the upper regions of the sides thereof.

12. The apparatus according to claim 11 wherein the lowest point in said V-shaped notches in said cathode shielding device is below the plane in which lies the upper edges of said trough.

13. An apparatus for electrolytic deposition of metal on a substrate, said apparatus comprised of a container for electrolyte, a cathode and an anode mounted in said container, and a cathode shielding device, said cathode shielding device comprising:

an elongated trough slidably mounted in guide means on a frame arranged in said container such that said trough is capable of confined movement in a vertical plane within said container, said frame being provided with drive means for imparting reciprocal movement in a horizontal plane within said container to said frame and to said trough slidably mounted in said frame;

said trough being provided with means for supporting one or more electroplatable substrates in a substantially vertical plane with the lower edge of each of said substrates located below the plane in which lies the upper edges of said trough;

said trough having buoyancy sufficient in the unloaded condition to float on electrolyte present in said container, but insufficient buoyancy to prevent immersion in said electrolyte in the loaded condition; and said trough having a plurality of perforations in the upper regions of the sides thereof.

14. The apparatus according to any of claims 11, 12 and 13 wherein said elongated trough is fabricated from buoyant plastic material.

15. The apparatus according to any of claims 11, 12 and 13 wherein said elongated trough is fabricated from polypropylene or polyethylene.

16. The apparatus according to any of claims 11, 12 and 13 wherein said elongated trough is provided with auxiliary buoyancy material.

17. The apparatus according to any of claims 11, 12 and 13 wherein said substrates are printed circuit boards.

* * * * *

REEXAMINATION CERTIFICATE (3767th)

United States Patent [19]

Wong

[11] B1 4,879,007
[45] Certificate Issued May 25, 1999

[54] SHIELD FOR PLATING BATH

[75] Inventor: Chi W. Wong, Kowloon, The Hong Kong Special Administrative Region of the People's Republic of China

[73] Assignee: Process Automation Int'l Ltd., Kowloon, The Hong Kong Special Administrative Region of the People's Republic of China

Reexamination Request:
No. 90/004,775, Oct. 10, 1997

Reexamination Certificate for:
Patent No.: 4,879,007
Issued: Nov. 7, 1989
Appl. No.: 07/282,751
Filed: Dec. 12, 1988

[51] Int. Cl.$^6$ ............... C25D 5/02; C25D 17/06
[52] U.S. Cl. ............... 205/96; 205/125; 204/225; 204/242; 204/279; 204/DIG. 7; 204/286; 204/297 R
[58] Field of Search ............... 205/96, 125; 204/275, 204/279, 225, 297 R, 297 W, 286, DIG. 7, 242

[56] References Cited

U.S. PATENT DOCUMENTS

| | | |
|---|---|---|
| 1,519,572 | 12/1924 | Wolf . |
| 2,101,178 | 12/1937 | Hogaboom et al. . |
| 2,859,166 | 11/1958 | Grigger . |
| 2,908,740 | 10/1959 | Chapman . |
| 3,090,823 | 5/1963 | Roach . |
| 3,821,097 | 6/1974 | Ettel ........................... 205/350 |
| 3,862,891 | 1/1975 | Smith . |
| 3,954,569 | 5/1976 | Vanderveer et al. . |
| 3,962,047 | 6/1976 | Wagner ....................... 204/DIG. 7 |
| 4,077,864 | 3/1978 | Vanderveer et al. . |
| 4,155,815 | 5/1979 | Francis et al. . |
| 4,359,375 | 11/1982 | Smith . |
| 4,401,522 | 8/1983 | Buschow et al. . |
| 4,426,266 | 1/1984 | Ukena et al. . |
| 4,534,832 | 8/1985 | Doiron, Jr. . |
| 4,678,545 | 7/1987 | Galik . |

FOREIGN PATENT DOCUMENTS

| | | |
|---|---|---|
| 3027751 C2 | 3/1989 | Germany . |
| 3726571C1 | 3/1989 | Germany . |
| 55-145199 | 11/1980 | Japan . |

*Primary Examiner*—Donald R. Valentine

[57] ABSTRACT

A floating shield is provided for use in an electrolytic plating bath. The shield comprises an elongated trough in which substrates are loaded for plating. The substrates are held in the trough with the lower edge of each substrate below the plane of the edges of the trough. The trough prior to loading is sufficiently buoyant to float on the surface of the electrolyte but sinks into the bath after loading with substrates. In one embodiment the trough is slidably mounted for reciprocating vertical movement in guide members which form part of a mechanical agitator mounted in the bath. The floating shield device serves to facilitate deposition of a uniformly thick layer of metal on the substrate and avoids excessive deposition at the lower extremities of the substrate.

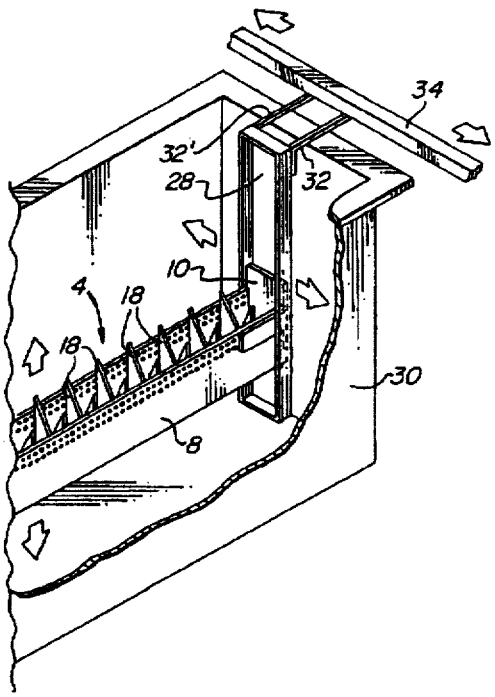

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 1 is determined to be patentable as amended.

Claims 2–17, dependent on an amended claim, are determined to be patentable.

New claims 18–26 are added and determined to be patentable.

1. In a method for the electrolytic deposition of a coating of metal having uniform thickness on an electroplatable substrate as cathode in an electrolyte bath equipped with anode, the improvement comprising supporting said substrate in a substantial vertical plane in an elongated trough, said trough being slidably mounted at each end in guide members and adapted for confined movement in a vertical plane in said electrolytic bath, [wherein] *said trough being provided with a plurality of plates having notches, said plates being distributed along and being aligned in substantially parallel vertical planes transverse to the longitudinal axis of said trough, for supporting one or more electroplatable substrates in a substantially vertical plane with the* lower edge of *each of* said [substrate is] *substrates* located below the plane in which lies the upper edges of said trough.

*18. A method according to claim 1 wherein the lowest points of the notches are below the plane in which the upper edges of said trough lies.*

*19. A method according to claim 1 wherein the notches comprise V-shaped notches.*

*20. A method for the electrolytic deposition of a coating of metal having uniform thickness on a electroplatable substrate as cathode in an electrolyte bath equipped with anode, the improvement comprising supporting said substrate in a substantially vertical plane in an elongated trough, said trough being slidably mounted at each end in guide members, adapted for confined movement in a vertical plane in said electrolytic bath, and having an upper region, said trough being formed of a material having a specific gravity less than that of the electrolytic bath, and having a bouyancy sufficient in the unloaded condition to float in said plating bath, but insufficient bouyancy to prevent immersion in said bath in the loaded condition, wherein the lower edge of said supported substrate is located below the plane in which lies the upper edges of said trough.*

*21. A method according to claim 20 wherein said trough further comprises a plurality of plates having notches, said plates being distributed along and being aligned substantially in parallel vertical planes transverse to the longitudinal axis of said trough, for supporting one or more electroplatable substrates in a substantially vertical plane with the lower edge of each of said substrates located below the plane in which lies the upper edges of said trough.*

*22. A method according to claim 21 wherein the notches comprise V-shaped notches.*

*23. A method as in claim 20 further comprising a means in the upper region of said trough for permitting electrolyte in the bath to flow therethrough.*

*24. A method according to claim 23 wherein said flow permitting means comprises perforations.*

*25. A cathode shielding device for use in an electrolytic plating bath, said device comprising:*

*an elongated trough having an upper region and being slidably mounted in a frame within which said trough is capable of confined movement in a vertical plane within said bath, said frame being provided with drive means for imparting reciprocal movement in a horizontal plane within said bath to said frame and to said trough slidably mounted in said frame;*

*said trough being provided with means for supporting one or more electroplatable substrates in a substantially vertical plane with the lower edge of said supported substrates located below the plane in which lies the upper edges of said trough, said substrate supporting means comprising a plurality of plates having V-shaped notches, said plates being distributed along and being aligned in substantially parallel vertical planes transverse to the longitudinal axis of said trough, for supporting one or more electroplatable substrates in a substantially vertical plane with the lower edge of each of said substrates located below the plane in which lies the upper edges of said trough;*

*said trough being formed of a material having buoyancy sufficient in the unloaded condition to float on said plating bath but insufficient buoyancy to prevent immersion in said bath in the loaded condition; and*

*said trough having a means in the upper region of said trough for permitting electrolyte in the bath to flow therethrough, said flow permitting means comprising perforations.*

*26. An apparatus for electrolytic deposition of metal on a substrate, said apparatus comprised of a container for electrolyte, a cathode and an anode mounted in said container, and a cathode shielding device, said cathode shielding device comprising:*

*an elongated trough having an upper region and being slidably mounted in guide means on a frame arranged in said container such that said trough is capable of confined movement in a vertical plane within said container, said frame being provided with drive means for imparting reciprocal movement in a horizontal plane within said container to said frame and to said trough slidably mounted in said frame;*

*said trough being provided with means for supporting one or more electroplatable substrates in a substantially vertical plane with the lower edge of said substrates located below the plane in which lies the upper edges of said trough;*

*said trough being formed of a material having a specific gravity less than that of the electrolyte and having a buoyancy sufficient in the unloaded condition to float on said electrolyte present in said container, but insufficient buoyancy to prevent immersion in said electrolyte in the loaded condition; and*

*said trough having a means in the upper region of said trough for permitting electrolyte to flow therethrough, said flow permitting means comprising perforations.*

\* \* \* \* \*